(12) United States Patent
Goller et al.

(10) Patent No.: US 11,088,009 B2
(45) Date of Patent: Aug. 10, 2021

(54) SUPPORT TABLE, SUPPORT TABLE ASSEMBLY, PROCESSING ARRANGEMENT, AND METHODS THEREOF

(71) Applicant: Infineon Technologies AG, Neubiberg (DE)

(72) Inventors: Bernhard Goller, Villach (AT); Walter Leitgeb, Wernberg (AT); Daniel Brunner, Villach (AT); Lukas Ferlan, Himmelberg (AT); Markus Ottowitz, Arnoldstein (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/514,632

(22) Filed: Jul. 17, 2019

(65) Prior Publication Data
US 2020/0027774 A1    Jan. 23, 2020

(30) Foreign Application Priority Data

Jul. 18, 2018  (DE) .......................... 102018117393.8

(51) Int. Cl.
| | |
|---|---|
| *H01L 21/683* | (2006.01) |
| *H01L 21/67* | (2006.01) |
| *B32B 38/00* | (2006.01) |
| *B32B 37/12* | (2006.01) |
| *H01L 21/78* | (2006.01) |

(52) U.S. Cl.
CPC .......... *H01L 21/6836* (2013.01); *B32B 37/12* (2013.01); *B32B 38/0008* (2013.01); *H01L 21/67092* (2013.01); *H01L 21/67115* (2013.01); *H01L 21/67248* (2013.01); *H01L 21/78* (2013.01); *B32B 2037/1253* (2013.01); *B32B 2457/14* (2013.01); *H01L 2221/68327* (2013.01)

(58) Field of Classification Search
CPC ..... B32B 38/0008; B32B 37/12; H01L 21/78; H01L 21/67248; H01L 21/67115; H01L 21/67092; H01L 21/6836
See application file for complete search history.

(56) References Cited

U.S. PATENT DOCUMENTS

| | | | |
|---|---|---|---|
| 6,333,493 B1 * | 12/2001 | Sakurai | F26B 3/28 118/725 |
| 6,387,209 B1 * | 5/2002 | Nettesheim | B29C 65/1435 156/379.6 |
| 6,589,809 B1 * | 7/2003 | Koopmans | H01L 21/67121 438/113 |
| 6,827,636 B2 | 12/2004 | Yamada | |
| D591,695 S * | 5/2009 | Oh | D13/180 |

(Continued)

FOREIGN PATENT DOCUMENTS

| | | |
|---|---|---|
| DE | 3884921 T2 | 2/1994 |
| DE | 102014111744 A1 | 2/2016 |

*Primary Examiner* — Daniel McNally
(74) *Attorney, Agent, or Firm* — Murphy, Bilak & Homiller, PLLC

(57) ABSTRACT

According to various embodiments, a support table may include: a baseplate including a support structure, the support structure defining a support region over the baseplate to support at least one of a workpiece or a workpiece carrier therein; and one or more light-emitting components disposed between the baseplate and the support region. The one or more light-emitting components are configured to emit light into the support region.

24 Claims, 11 Drawing Sheets

(56) References Cited

U.S. PATENT DOCUMENTS

| | | |
|---|---|---|
| 2002/0108707 A1* | 8/2002 | Kobayashi ........ B29C 66/91212 |
| | | 156/275.5 |
| 2003/0207497 A1 | 11/2003 | Koopmans |
| 2004/0016504 A1* | 1/2004 | Mitarai ............... H01L 21/6836 |
| | | 156/247 |
| 2006/0163999 A1 | 7/2006 | Murazaki et al. |
| 2007/0128834 A1* | 6/2007 | Nakamura ............. B23K 26/40 |
| | | 438/460 |
| 2011/0139375 A1 | 6/2011 | Yamamoto et al. |
| 2017/0287765 A1 | 10/2017 | Yoshihara et al. |

* cited by examiner

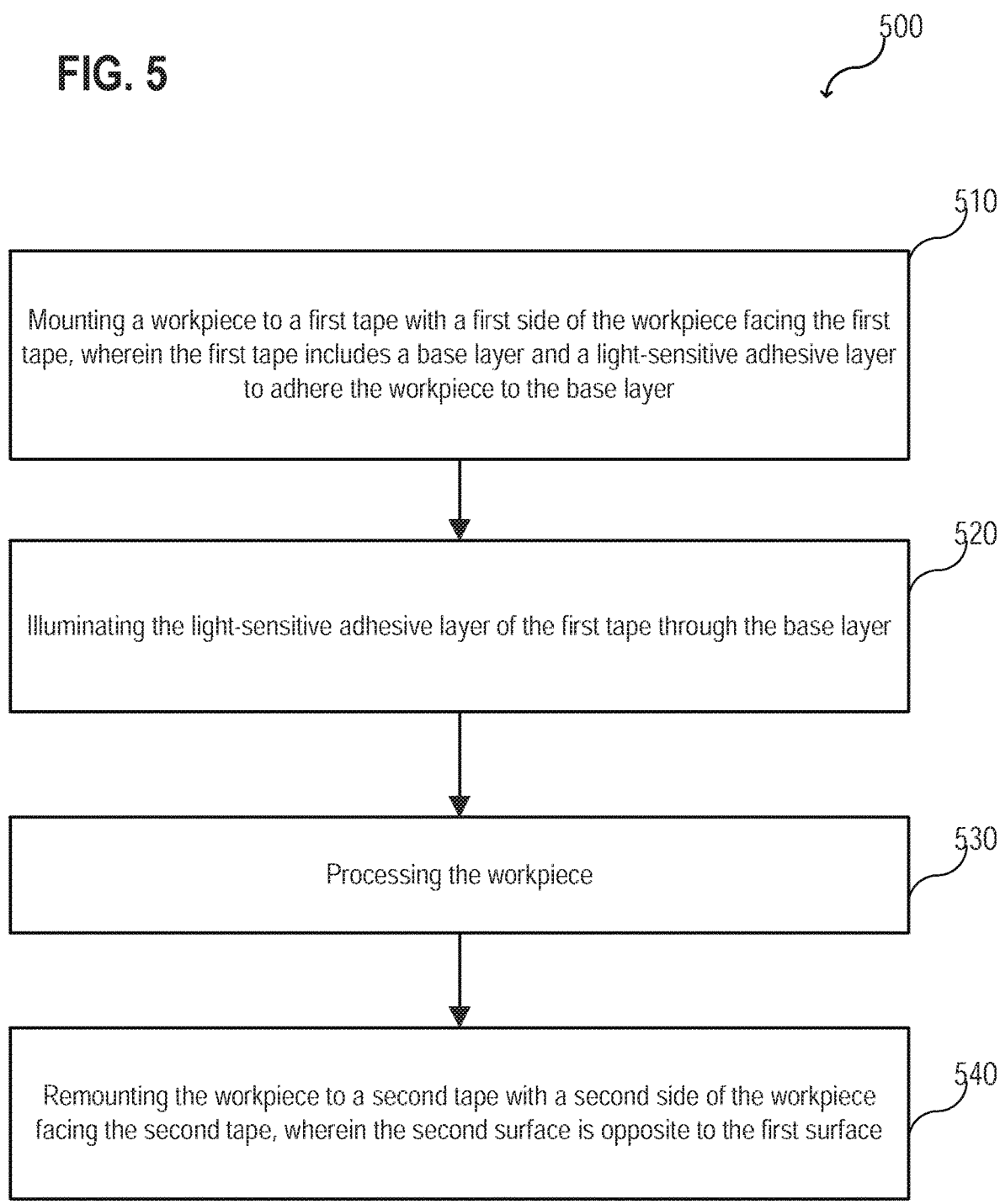

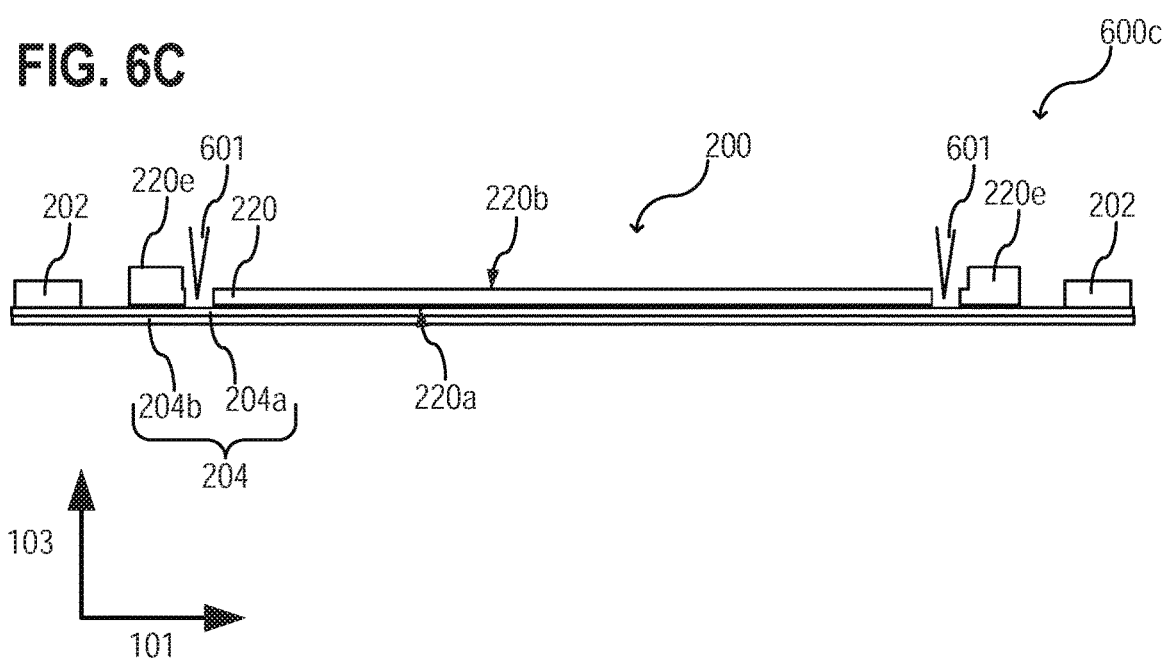
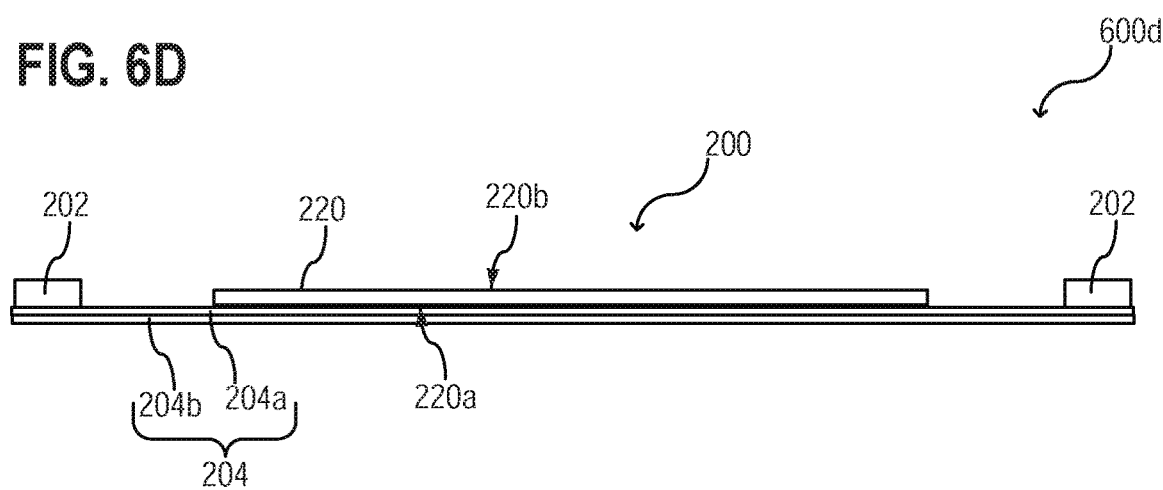

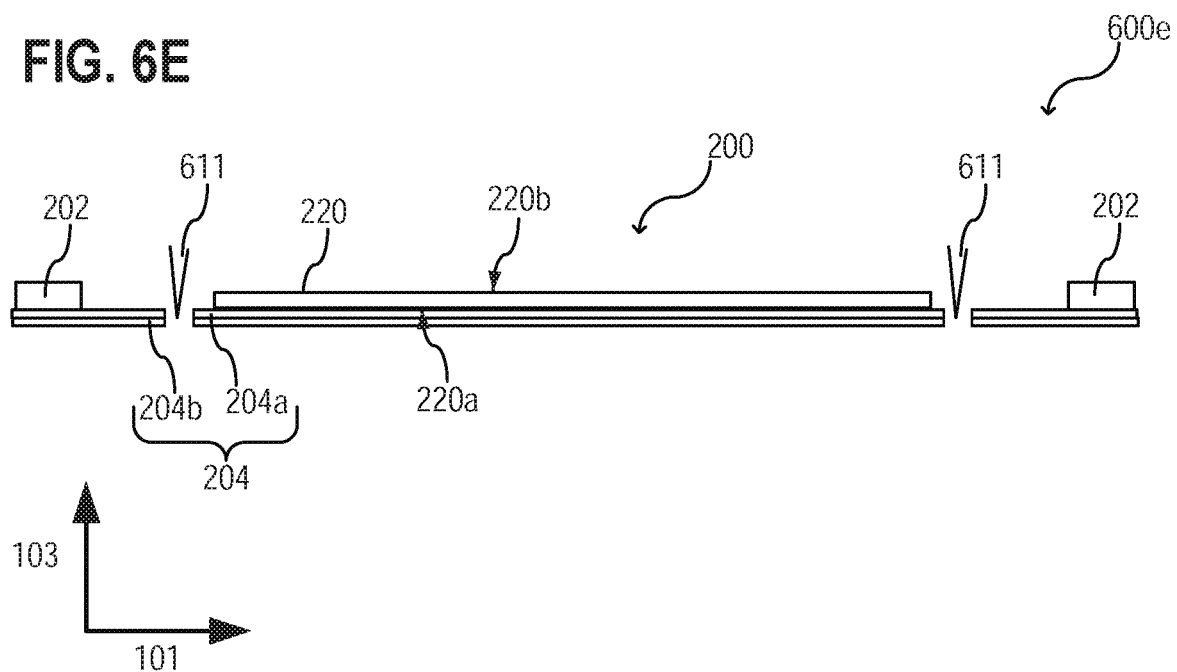
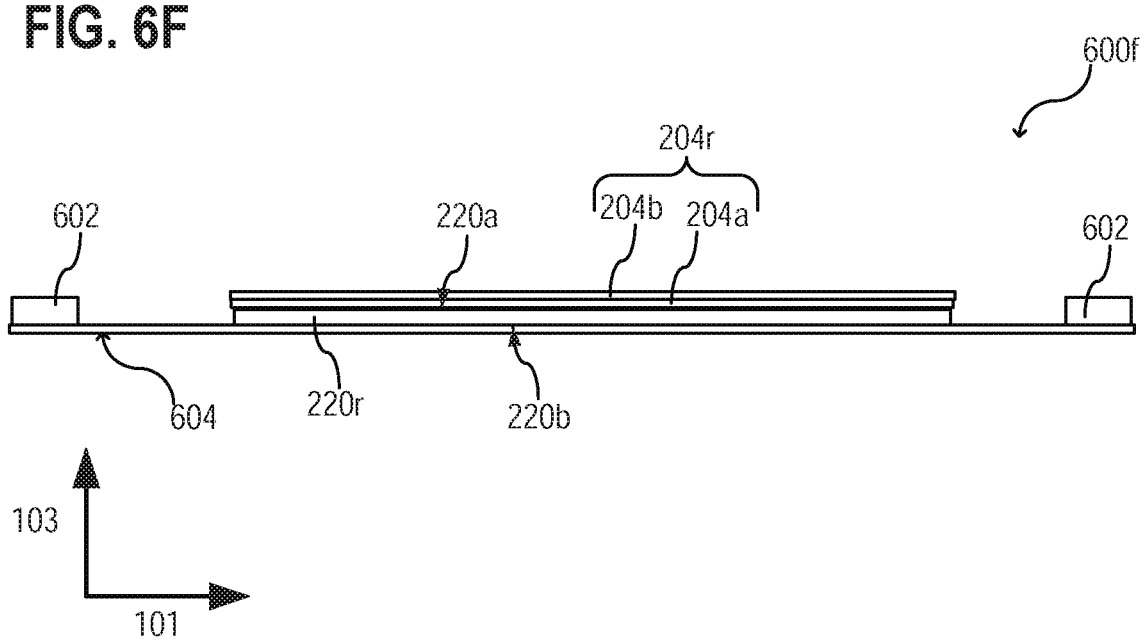

SUPPORT TABLE, SUPPORT TABLE ASSEMBLY, PROCESSING ARRANGEMENT, AND METHODS THEREOF

TECHNICAL FIELD

Various embodiments relate generally to a support table, a support table assembly, a processing arrangement, and methods thereof, e.g. a method for processing a workpiece.

BACKGROUND

In general, a workpiece may be processed in various different types of processes. As an example, a workpiece processed in semiconductor technology (e.g. a semiconductor wafer, a glass substrate, a metal substrate, a polymer substrate, etc.) may be etched, coated, doped, annealed, thinned, etc., via various types of processes. As an example, the workpiece may be positioned in one or more processing tools via any suitable positioning system. As an example, a workpiece processed in semiconductor technology may be placed onto a support table (also referred to chuck, wafer chuck, positioning table, etc.). Various types of support tables may be known. In some technologies, it may be beneficial to process and/or handle a single workpiece, wherein the single workpiece includes a plurality of portions associated with a plurality of microelectronic devices, micromechanical devices, microelectromechanical devices, etc. As an example, a single semiconductor wafer may include a plurality of portions associated with a plurality of chips (also referred to as dies). After processing the semiconductor wafer as a single piece, the semiconductor wafer may be diced, and thereby a plurality of dies (also referred to as chips) is provided from the wafer. During a dicing process, the wafer may be attached to a dicing tape. In various processes, the wafer may be thinned, e.g. via grinding, before and/or during the dicing process.

SUMMARY

Various embodiments are related to a support table. The support table may include a baseplate with a support structure, wherein the support structure may define a support region over the baseplate to support at least one of a workpiece or a workpiece carrier therein. The support table may further include, one or more light-emitting components disposed between the baseplate and the support region, wherein the one or more light-emitting components are configured to emit light into the support region.

According to various embodiments, a processing arrangement is provide including a processing tool for processing a workpiece or a workpiece carrier; and support table to support the workpiece or the workpiece carrier in the processing tool.

Various embodiments are related to a support table assembly for processing a workpiece. The support table assembly may include a workpiece carrier, wherein the workpiece carrier may include a tape frame and a tape attached to the tape frame, and wherein the tape may include a base layer and a light-sensitive adhesive layer to adhere a workpiece to the workpiece carrier. The support table assembly may further include a support table to support the workpiece carrier, wherein the support table may include one or more light-emitting components configured to emit light in the direction of the tape when the workpiece carrier is supported by the support table, and wherein the base layer of the tape may be transparent for the light emitted by the one or more light-emitting components for illumination of at least the light-sensitive adhesive layer of the tape.

Those skilled in the art will recognize additional features and advantages upon reading the following detailed description, and upon viewing the accompanying drawings.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 5 shows a flow diagram of a method for processing a workpiece, according to various embodiments;

FIGS. 6A to 6H show a workpiece carrier and an attached workpiece in a various schematic cross-sectional views during a method for processing the workpiece, according to various embodiments;

DETAILED DESCRIPTION

Figure 1A:
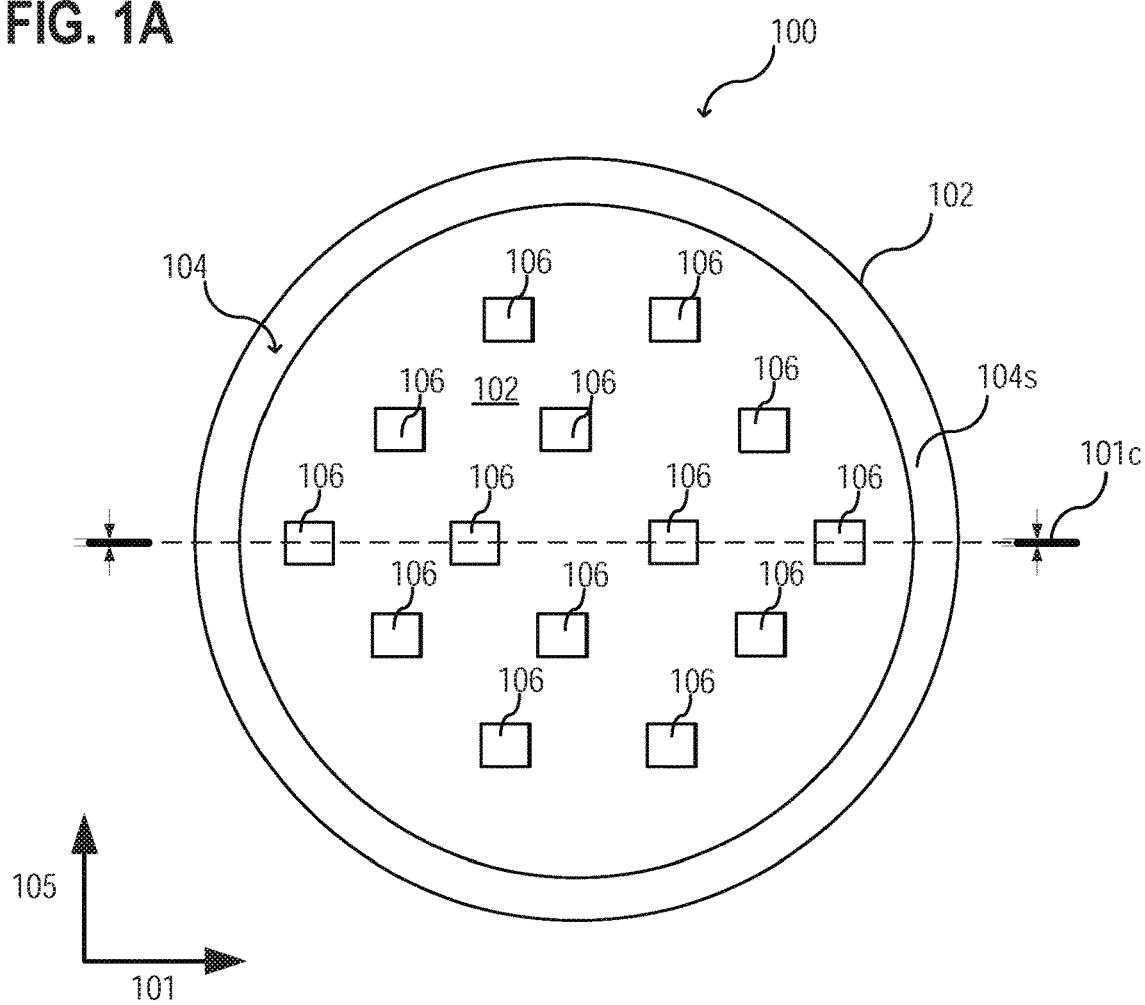
FIGS. 1A to 1F show a support table in various schematic views, according to various embodiments.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized, and structural, logical, and electrical changes may be made without departing from the scope of the invention. The various embodiments are not necessarily mutually exclusive, as some embodiments can be combined with one or more other embodiments to form new embodiments. Various embodiments are described in connection with methods and various embodiments are described in connection with devices. However, it may be understood that embodiments described in connection with methods may similarly apply to the devices, and vice versa.

The terms "at least one" and "one or more" may be understood to include any integer number greater than or equal to one, i.e. one, two, three, four, [ . . . ], etc. The term "a plurality" may be understood to include any integer number greater than or equal to two, i.e. two, three, four, five, [ . . . ], etc.

The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of listed elements.

The word "over", used herein to describe forming a feature, e.g. a layer "over" a side or surface, may be used to mean that the feature, e.g. the layer, may be formed "directly on", e.g. in direct contact with, the implied side or surface. The word "over", used herein to describe forming a feature, e.g. a layer "over" a side or surface, may be used to mean that the feature, e.g. the layer, may be formed "indirectly on" the implied side or surface with one or more additional layers being arranged between the implied side or surface and the formed layer.

In like manner, the word "cover", used herein to describe a feature disposed over another, e.g. a layer "covering" a side or surface, may be used to mean that the feature, e.g. the layer, may be disposed over, and in direct contact with, the implied side or surface. The word "cover", used herein to describe a feature disposed over another, e.g. a layer "covering" a side or surface, may be used to mean that the feature, e.g. the layer, may be disposed over, and in indirect contact with, the implied side or surface with one or more additional layers being arranged between the implied side or surface and the covering layer.

The term "lateral" used with regards to the "lateral" dimension of a structure (or of a structure element) provided on or in a carrier (e.g. a layer, a substrate, a wafer, or a semiconductor workpiece) or "laterally" next to, may be used herein to mean a dimension or a positional relationship along a surface of the carrier. That means that a surface of a carrier (e.g. a surface of a substrate, a surface of a wafer, or a surface of a workpiece) may serve as reference, commonly referred to as the main processing surface. Further, the term "width" used with regards to a "width" of a structure (or of a structure element) may be used herein to mean the lateral dimension of a structure. Further, the term "height" used with regards to a height of a structure (or of a structure element), may be used herein to mean a dimension of a structure along a direction perpendicular to the surface of a carrier (e.g. perpendicular to the main processing surface of a carrier). The term "thickness" used with regards to a "thickness" of a layer may be used herein to mean the spatial dimension of the layer perpendicular to the surface of the support (the material or material structure) on which the layer is deposited. If a surface of the support is parallel to the surface of the carrier (e.g. parallel to the main processing surface) the "thickness" of the layer deposited on the surface of the support may be the same as the height of the layer.

According to various embodiments, the term wafer used herein may include any suitable type of substrate having a plate-shape. The wafer may have diameter or lateral dimension greater than about 10 cm, e.g. in the range from about 10 cm to about 50 cm, or even greater than 50 cm. The wafer may have a thickness in the range from about 50 μm to about 1 mm, e.g. in the range from about 50 μm to about 750 μm.

According to various embodiments, the wafer may be a semiconductor wafer. According to various embodiments, the semiconductor wafer may be made of silicon or may include silicon. However, other semiconductor materials of various types may be used in a similar way, e.g. germanium, Group III to V (e.g. SiC), or other types, including for example polymers. In an embodiment, the semiconductor wafer includes doped semiconductor material (e.g. p-type doped or n-type doped semiconductor material). According to various embodiments, the semiconductor wafer may be a semiconductor (e.g. silicon) on insulator (SOI) wafer. The semiconductor on insulator (SOI) wafer may include a body region, an insulator region over the body region, and a semiconductor region over the insulator region, the insulator region is configured to separate (e.g. spatially and/or electrically) the body region from the semiconductor region. The semiconductor region may include a semiconductor material (e.g. silicon). The body region may also include a semiconductor material (e.g. silicon). The insulator region may include one or more cavities and/or one or more insulating layers (e.g. oxide layers).

In the following, various embodiments are described with reference to a semiconductor wafer (referred to as wafer). However, another workpiece than a wafer, e.g., a plate-shaped workpiece, may be handled in the same way or in a similar way as described herein with reference to a wafer. A plate-shaped workpiece may include, for example, glass, carbon, one or more metals, one or more polymers, etc. A plate-shaped workpiece may include, for example, one or more electrically insulating material (e.g. an oxide, a nitride, etc.), one or more semiconducting materials (e.g. silicon, silicon carbide, gallium arsenide, etc.), one or more metals (e.g. copper, aluminum, silver, gold, palladium, platinum, etc.), etc.

According to various embodiments, a wafer may include a patterned side that is processed to form one or more components on the wafer. The patterned side of the wafer is in general referred to as front side of the wafer or main processing surface of the wafer. In some processes, the wafer may be processed from the backside. As an example, the wafer may be thinned from the backside via grinding. As another example, a backside metallization process may be used to from a backside metallization on the backside of the wafer.

Various embodiments may be related to a suitable way for handling a wafer during processing the wafer from the backside. To process the backside of the wafer, the front side of the wafer that may include damageable structures may face downwards and may be in direct physical contact with a support that is used to handle the wafer during processing of the backside.

According to various embodiments, a tape may be attached to the front side of the wafer, wherein the tape may fulfil several requirements, as, for example,
    compatible for semiconductor processes and semiconductor tools (e.g. one or more mounting processes, one or more ring cut processes, one or more ring remove processes, etc.), and
    residue less removable (e.g. substantially no glue and/or other tape residues should remain on the front side of the wafer after peeling the tape from the front side of the wafer).

Various embodiments may be based on the finding that a tape (e.g. a sawing tape, also referred to as dicing tape) that has a light-sensitive adhesive layer can be used for handling the wafer with the front side of the wafer facing the tape, in the case that the light-sensitive adhesive layer of the tape is exposed to light already after mounting (e.g. within a time frame of less than about 12 h, e.g. less than 6 h, e.g. less than 3 h) and before further processing the wafer from the backside to fulfil the abovementioned requirements.

According to various embodiments, the wafer may be fully supported by the tape. Further, no hairline cracks may occur during a ring cut process that may be carried out after exposure of the light-sensitive adhesive layer to light. In some aspects, the wafer may be remounted to another tape with the backside of the wafer facing the other tape, e.g. after the ring cut process and a ring remove process is carried out.

According to various embodiments, the chips or dies may be hold in position properly during a subsequent dicing process due to a remount of the wafer before the dicing process is carried out. According to various embodiments, the tape selection for dicing (e.g. sawing) and/or pick-up processes may be uncoupled from the ring cut and ring remove process that is carried out before dicing.

According to various embodiments, an in-situ light exposure may be implemented at a stage in which the wafer is attached with its front side to the adhesive tape. As an example, the wafer may not be further processed after attachment to the adhesive tape until the light-sensitive adhesive layer of the adhesive tape is exposed to light.

According to various embodiments, the light that may be used to modify the light-sensitive adhesive layer may be ultra-violet (UV) light. This may include a light exposure with electromagnetic radiation having a peak wavelength in the ultra-violet range of the spectrum (e.g. with a peak wavelength in the range from about 10 nm to about 380 nm, e.g. in the range from about 150 nm to about 380 nm). Accordingly, the light-sensitive adhesive layer may be a UV-sensitive adhesive layer.

According to various embodiments, one or more properties (e.g. the adhesion force, etc.) of the light-sensitive adhesive layer may be modified by the light exposure. As an example, the adhesion force between the wafer and a base layer of the tape may be caused by the light-sensitive adhesive layer disposed between the wafer and the base layer, wherein this adhesion force may be reduced by exposing the light-sensitive adhesive layer to the corresponding light. As an example, an UV-sensitive adhesive layer may be exposed to UV-light to degrade the adhesion properties (e.g. the adhesion force) of the UV-sensitive adhesive layer.

Figure 1B:
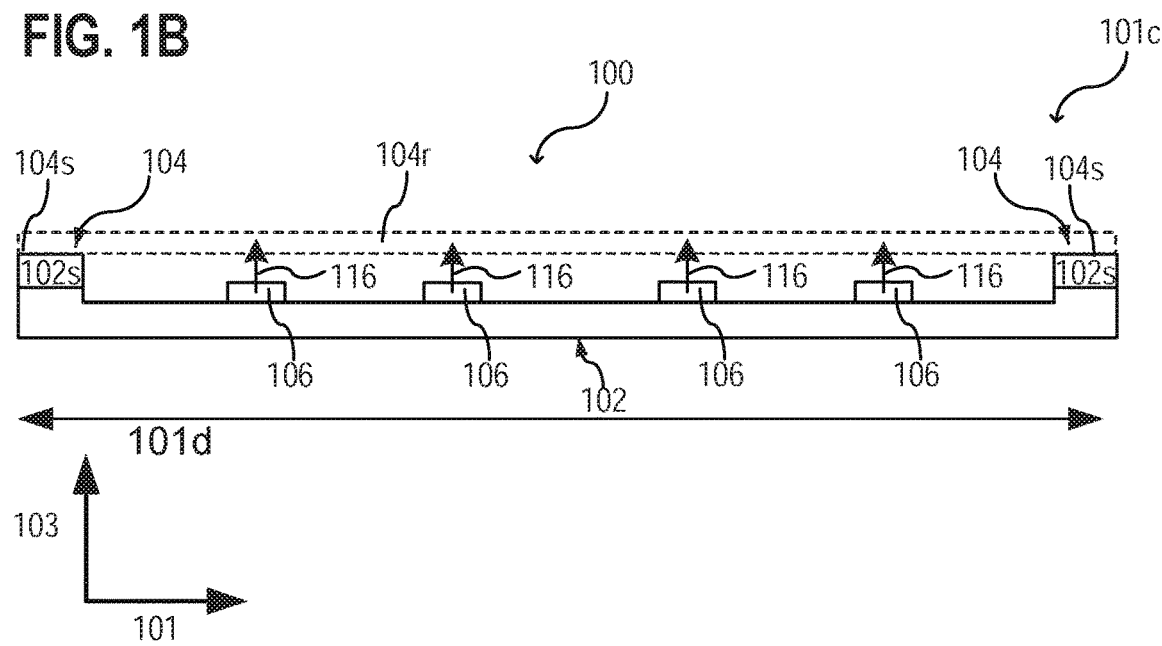

FIG. 1A and FIG. 1B show a support table 100 in a schematic top view and a schematic cross-sectional view (see cross section line 101c), according to various embodiments. The directions 101, 105 shown in the figures may be lateral directions and the direction 103 may be a height direction perpendicular to the lateral directions 101, 105. According to various embodiments, the support table 100 may include a baseplate 102. The baseplate 102 may include or may consist of any suitable type of material. In some embodiments, the baseplate 102 may be a metal plate, e.g. including or made of steel, aluminum, etc. According to various embodiments, the baseplate 102 may be a single piece (as illustrate, for example, in FIGS. 1A and 1B). Alternatively, the baseplate 102 may include a plurality of different pieces mounted to another.

According to various embodiments, the support table 100 may further include a support structure 104. The support structure 104 may be configured to provide a support region 104r over the baseplate 102. The support structure 104 may be configured to allow a support of at least one of a workpiece or a workpiece carrier in the support region 104r.

According to various embodiments, at least a part of the support structure 104 may be provided by the baseplate 102. As an example, the baseplate 102 may include one or more portions 102s configured to provide one or more support surfaces 104s to support an edge region of a workpiece (e.g. of a wafer) thereon and/or to support a workpiece carrier (e.g. of a tape frame that may be used to handle a wafer) thereon. Illustratively, one or more top surfaces of the baseplate 102 may be the support surfaces 104s of the support structure 104. However, the support structure 104 may include one or more additional components (e.g. a support plate, etc.) disposed at least one of over or on the baseplate 102. Alternatively, the support structure 104 may not be part of the baseplate 102. In this case, the support structure 104 may include one or more components (e.g. a support plate, clamps, etc.) disposed at least one of over or on the baseplate 102 to provide one or more support surfaces 104s to support an edge region of a workpiece (e.g. of a wafer) thereon and/or to support a workpiece carrier (e.g. of a tape frame that may be used to handle a wafer) thereon.

According to various embodiments, the support table 100 may include one or more light-emitting components 106. The one or more light-emitting components 106 may be disposed between the baseplate 102 and the support region 104r. The one or more light-emitting components 106 may be configured to emit light 116 into the support region 104r.

According to various embodiments, the support region 104r may have a width or diameter 101d in the range from about 10 cm to about 50 cm. This may allow hosting a wafer in the support region 104r that has a width or a diameter in a similar range or in the same range.

Figure 1C:
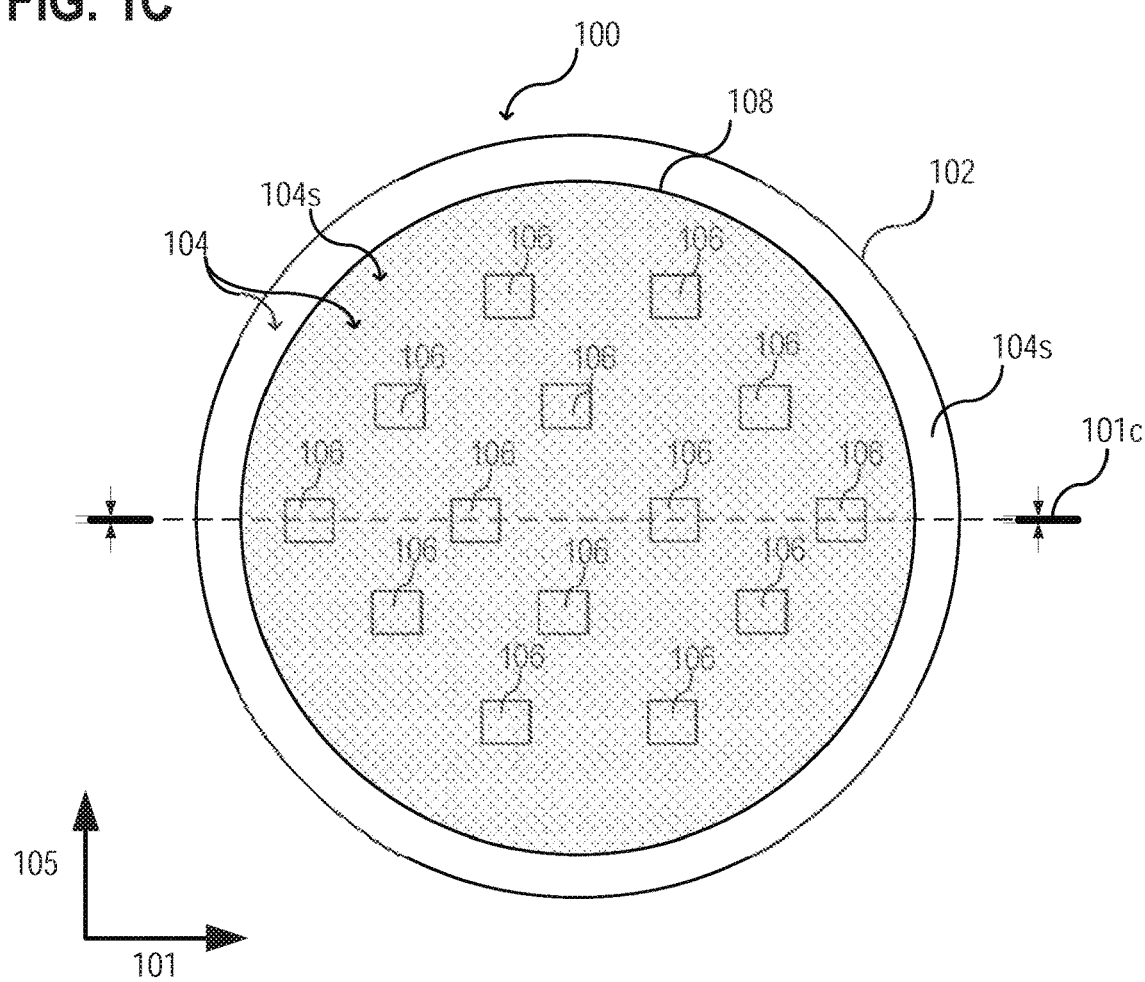
Figure 1D:
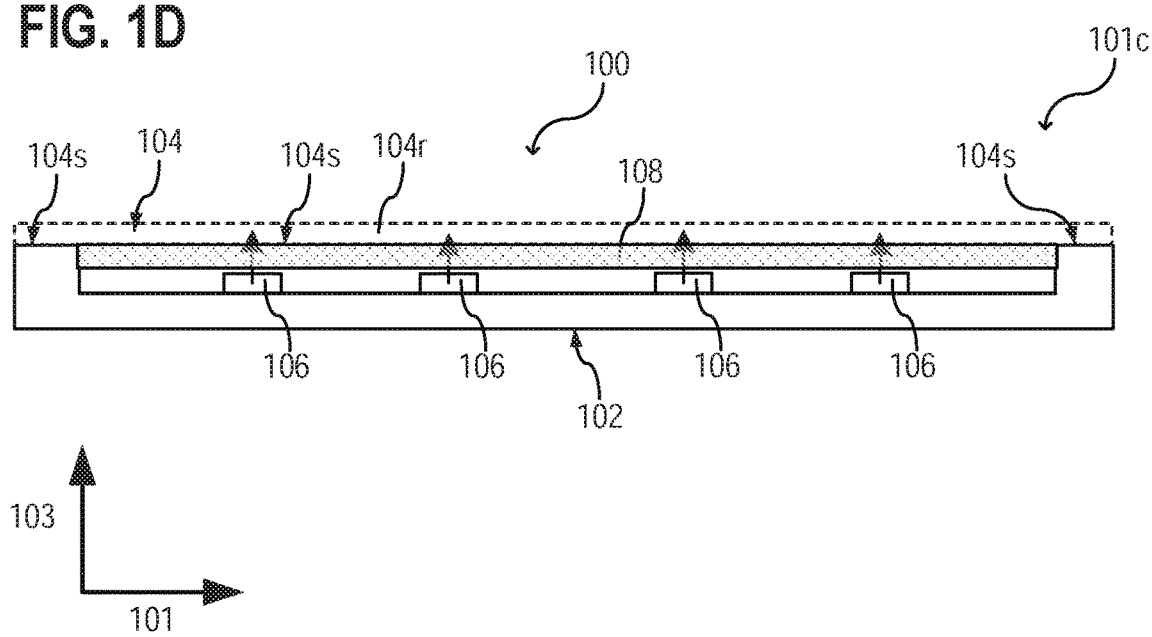

FIG. 1C and FIG. 1D show the support table 100 in a schematic top view and a schematic cross-sectional view (see cross section line 101c), according to various embodiments. According to various embodiments, the support table 100 may include a support plate 108 disposed between the support region 104r and the baseplate 102. The support plate 108 may include one or more support surfaces 104s facing away from the baseplate 102 to support at least one of a workpiece or a workpiece carrier thereon. The support plate 108 may be part of the support structure 104 or may be the support structure 104. As an example, the support plate 108 may provide a support surface 104s to support an edge region of a workpiece (e.g. of a wafer) thereon and/or to support a workpiece carrier (e.g. of a tape frame that may be used to handle a wafer) thereon.

As illustrated, for example, in FIG. 1D, the one or more light-emitting components 106 may be configured to emit the light 116 in the direction of the support plate 108. The support plate 108 is, in this case, configured to pass the light 116 (that is emitted from the one or more light-emitting components 106) through the support plate 108 into the support region 104r. In this case, the support plate 108 may include or may consist of, for example, a material that is transparent for the light 116 (that is emitted from the one or more light-emitting components 106). The light 116 that is emitted from the one or more light-emitting components 106 may be ultra-violet light and the support plate 108 may be transparent for the ultra-violet light. According to various embodiments, the support plate 108 may include or may consist of glass, e.g. a silica-based glass, to be transparent for ultra-violet light. According to various embodiments, the support plate 108 may include or may consist of satinized glass.

According to various embodiments, the term "transparent" as used herein with respect to light may include, for example, that a substantive portion (e.g. more than 50%) of the light is transmitted through the respective structure.

According to various embodiments, the support plate 108 may include a transparent material. Alternatively or additionally, the support plate 108 may include one or more holes extending from a top surface of the support plate 108 (e.g. from the support surface 104s provided by the support plate 108) through the support plate 108, also referred to as through holes.

Figure 1E:
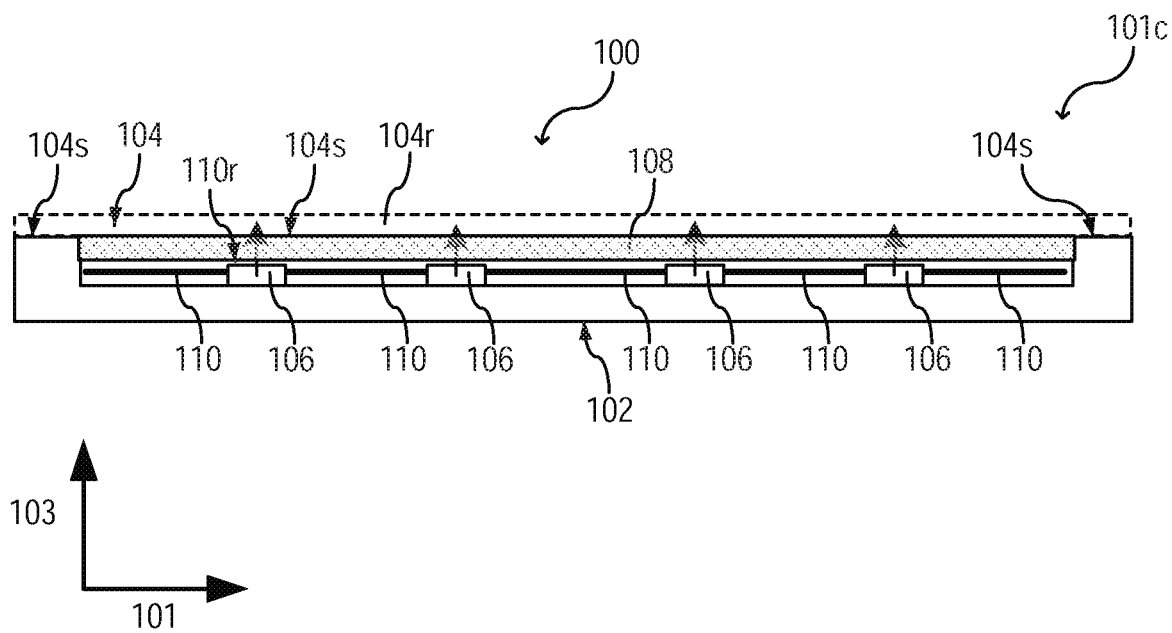

FIG. 1E shows the support table 100 in a schematic cross-sectional view, according to various embodiments. The support table 100 may include a reflector 110. The reflector 110 may have a plate-shape.

According to various embodiments, the reflector 110 may be disposed between the baseplate 102 and the support region 104r. The reflector 110 may include one or more recesses 110r associated with the one or more light-emitting components 106. The one or more recesses 110r of the reflector 110 may allow an efficient illumination of the support region 104r.

According to various embodiments, the one or more light-emitting components 106 may be disposed within the one or more recesses 110r and/or the one or more light-emitting components 106 may be configured to emit the light 116 through the one or more recesses 110r of the reflector into the support region 104r.

According to various embodiments, the reflector 110 may include a material that reflects ultra-violet light. As an example, the reflector 110 may include aluminum or may consist of aluminum.

Figure 1F:
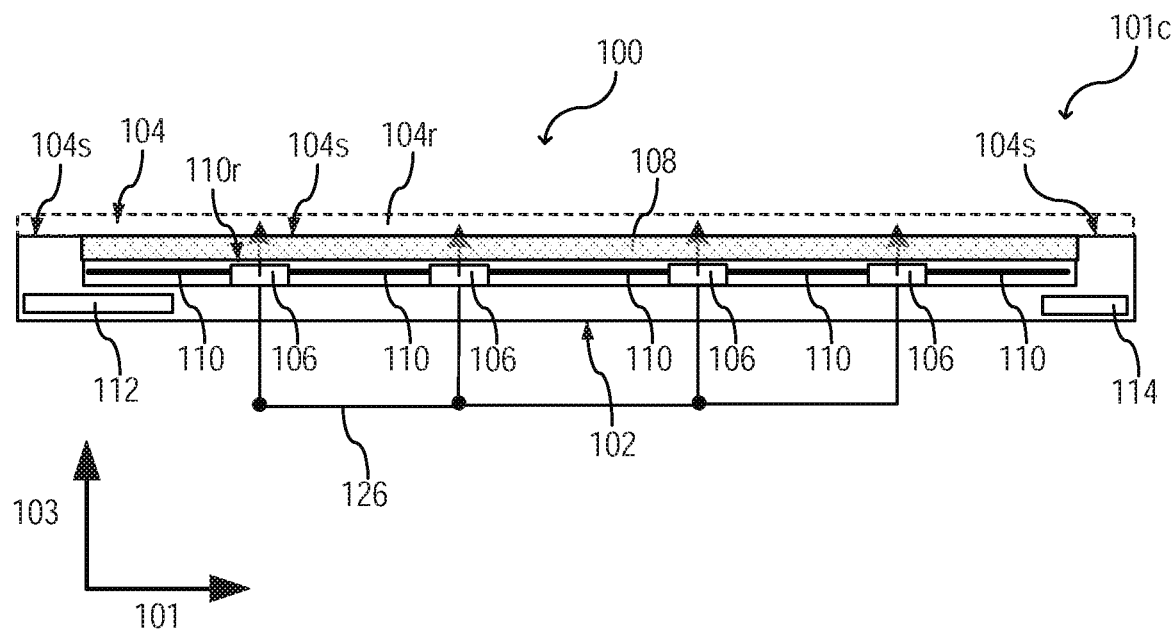

FIG. 1F shows the support table 100 in a schematic cross-sectional view, according to various embodiments. The support table 100 may include one or more components for operating, supporting, and/or monitoring the one or more light-emitting components 106.

According to various embodiments, the support table 100 may include an electrical supply structure 126 to provide electrical power to the one or more light-emitting components 106. The electrical supply structure 126 may include a wiring. The wiring may be at least partially embedded into the baseplate 102 and the one or more light-emitting components 106 may be attached (e.g. directly) to the baseplate 102. Alternatively, the support table 100 may include a mounting plate that may be attached to the baseplate 102. In this case, the one or more light-emitting components 106 may be attached (e.g. directly) to the mounting plate and the wiring may be at least partially embedded into the mounting plate (not illustrated in FIG. 1F).

According to various embodiments, the support table 100 may include cooling structure 112 configured to dissipate heat from the one or more light-emitting components 106. The cooling structure 112 may include, for example, one or more cooling channels disposed in the baseplate 102. This may allow dissipating heat from the one or more light-emitting components 106 via a cooling fluid, e.g. a cooling gas or a cooling liquid.

According to various embodiments, the support table 100 may include a temperature sensor 114 associated with the one or more light-emitting components 106. The temperature sensor 114 may be, for example, disposed in and/or on the baseplate 102. Alternatively, in the case that a mounting plate is used to carry the one or more light-emitting components 106, the temperature sensor 114 may be, for example, disposed in and/or on the mounting plate.

Figure 2:
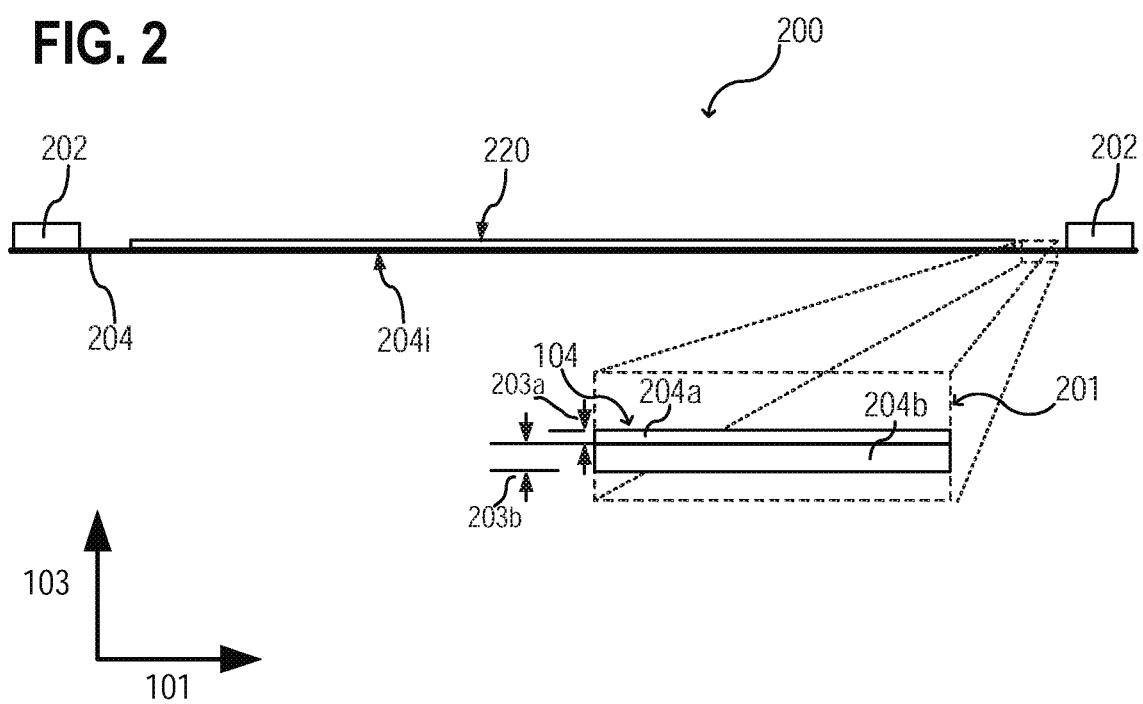
FIG. 2 shows a workpiece carrier in a schematic cross-sectional view, according to various embodiments.

FIG. 2 shows a workpiece carrier 200 in a schematic cross-sectional view, according to various embodiments. The workpiece carrier 200 may be used, for example, to handle a workpiece (e.g. a wafer) during processing. According to various embodiments, the workpiece carrier 200 may include a tape frame 202 and a tape 204 attached to the tape frame 202. The tape frame 202 may have a ring-shape. According to various embodiments, a workpiece 220 may be attached to the tape 204, e.g. to an inner portion 204i of the tape 204 that is laterally (e.g. along lateral direction 101) surrounded by the tape frame 202.

According to various embodiments, the tape 204 (as illustrated in the detailed view 201 in FIG. 2) may include a base layer 204b and a light-sensitive adhesive layer 204a to adhere the workpiece 220 to the workpiece carrier 200. As an example, the workpiece 220 may be a semiconductor wafer and the workpiece carrier 200 may be a tape-frame based wafer carrier. According to various embodiments, the tape 204 may be a dicing tape.

According to various embodiments, the base layer 204b of the tape 204 may include one or more polymers or may consist of one or more polymers. As an example, the polymer may be a poly olefin (PO), e.g. at least one of polyethylene (PE), polypropylene (PP), polymethylpentene (PMP), polybutene-1 (PB-1), polyisobutylene (PIB), ethylene propylene rubber (EPR), or ethylene propylene diene monomer rubber (EPDM rubber). According to various embodiments, the polymer may be polyvinyl chloride (PVC). According to various embodiments, the base layer 204b of the tape 204 may have a layer thickness 203b in the range from about 60 μm to about 300 μm.

According to various embodiments, the base layer 204b of the tape 204 may be transparent to light, e.g. to the light 116 emitted by the one or more light-emitting components 106 of the support table 100. As an example, the one or more light-emitting components 106 may emitted UV-light and the base layer 204b of the tape 204 may be transparent to UV-light.

According to various embodiments, the light-sensitive adhesive layer 204a of the tape 204 may include or may consist of an adhesive material. The adhesive material may be configured to reduce its adhesion properties when exposed to ultra-violet light. The light-sensitive adhesive layer 204a of the tape 204 may include or may consist of an UV-sensitive acrylic adhesive (UV-curable acrylic pressure-sensitive adhesives (acrylic PSAs)). According to various embodiments, the light-sensitive adhesive layer 204a of the tape 204 may have a layer thickness 203a in the range from about 5 μm to about 25 μm.

Figure 3:
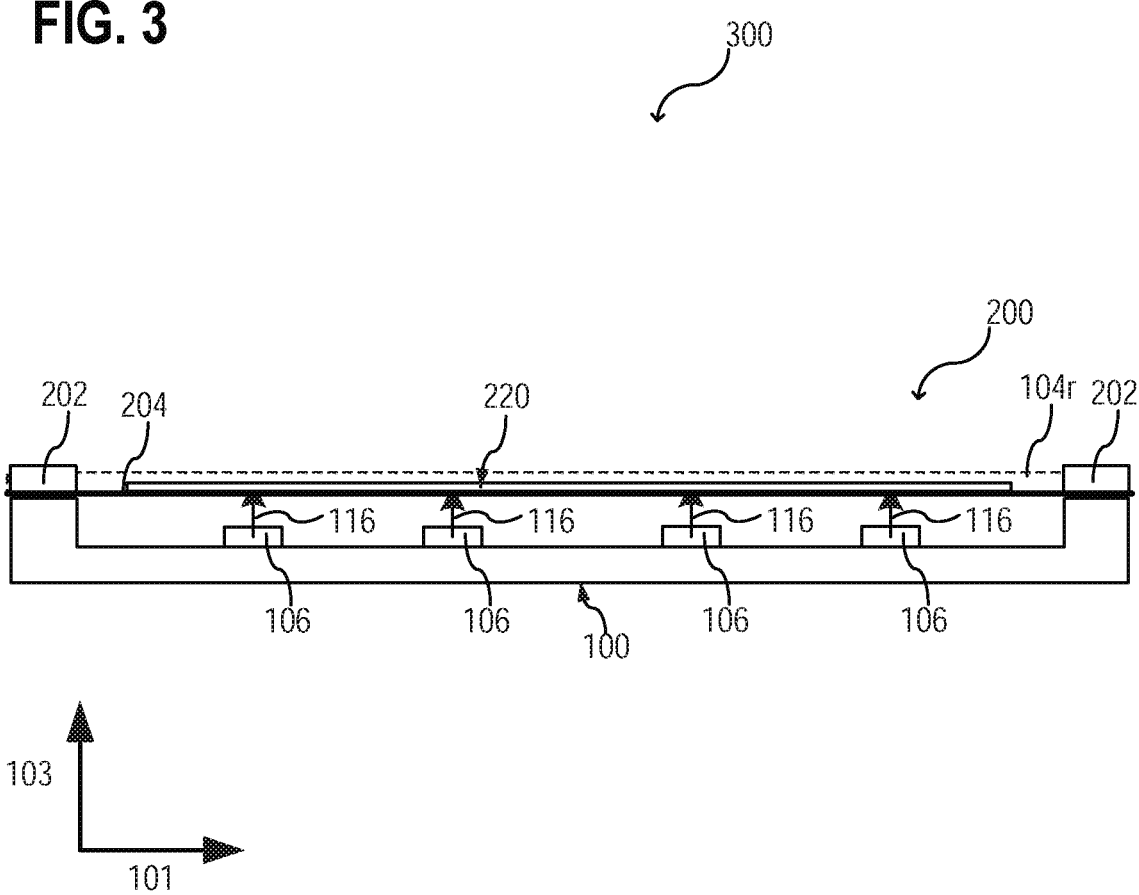
FIG. 3 shows a support table assembly in a schematic cross-sectional view, according to various embodiments.

FIG. 3 shows a support table assembly 300 in a schematic cross-sectional view, according to various embodiments. According to various embodiments, the support table assembly 300 may be configured to process a workpiece 220.

According to various embodiments, the support table assembly 300 may include a workpiece carrier 200 (see, for example, FIG. 2) and a support table 100 (see, for example, FIGS. 1A to 1F) to support the workpiece carrier 200.

According to various embodiments, the workpiece carrier 200 may include a tape frame 202 and a tape 204 attached to the tape frame 202. The tape may include a base layer 204b and a light-sensitive adhesive layer 204a to adhere a workpiece 220 to the workpiece carrier 200. The support table 100 may be configured to support the workpiece carrier 200. The support table 100 may include one or more light-emitting components 106 configured to emit light 116 into the direction of the tape 204 when the workpiece carrier 200 is supported by the support table 100. The base layer 204b of the tape 204 may be transparent for the light 116 emitted by the one or more light-emitting components 106. This allows, for example, an illumination of at least the light-sensitive adhesive layer 204a of the tape 204, for example, to reduce the adhesion force between the workpiece 220 and the base layer 204b of the tape 204.

Figure 4:
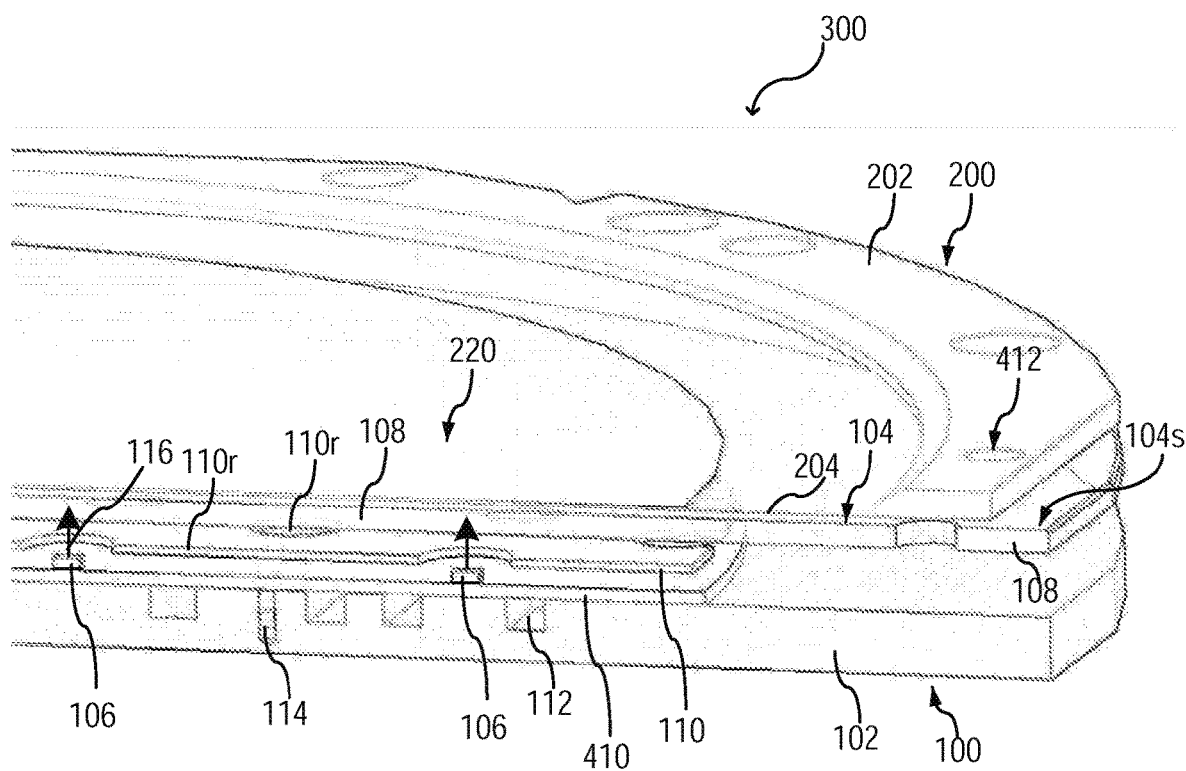
FIG. 4 shows a support table assembly in a schematic perspective view, according to various embodiments.

FIG. 4 shows a support table assembly 300 in a schematic cross-sectional view, according to various embodiments. According to various embodiments, the support table assembly 300 may be configured in a similar way or the same way as described above with reference to FIG. 3.

According to various embodiments, the support table assembly 300 illustrated in FIG. 4 may include, for example, a reflector 110 disposed between the baseplate 102 and the support region 104r, wherein the reflector 110 includes one or more recesses 110r associated with the one or more light-emitting components 106.

According to various embodiments, the one or more light-emitting components 106 of the support table 100 may be attached to a mounting plate 410. The mounting plate 410 may be disposed over the baseplate 102 and, for example, may be attached to the baseplate 102.

According to various embodiments, the support structure 104 of the support table 100 may include one or more attachment structures 412 to attach the workpiece carrier 200 to the support structure 104. The one or more attachment structures 412 may include a vacuum mount, e.g. to mount a tape frame to the one or more support surfaces 104s provided by the baseplate 102 and/or the support plate 108.

FIG. 5 shows a flow diagram of a method 500 for processing a workpiece, according to various embodiments. In some embodiments, the support table 100, the workpiece carrier 200, and/or the support table assembly 300 as described herein may be used to carry out the method 500.

According to various embodiments, the method 500 may include: in 510 mounting a workpiece to a first tape with a first side of the workpiece facing the first tape, wherein the first tape includes a base layer and a light-sensitive adhesive layer to adhere the workpiece to the base layer; in 520, e.g. after mounting the workpiece to the first tape, illuminating the light-sensitive adhesive layer of the first tape through the base layer; in 530, e.g. after illuminating the light-sensitive adhesive layer of the first tape, processing the workpiece; and, in 540, subsequently, remounting the workpiece to a second tape with a second side of the workpiece facing the second tape, wherein the second surface is opposite to the first surface.

FIG. 6A to FIG. 6D show a workpiece carrier 200 (e.g. a wafer carrier) and a workpiece 220 (e.g. a wafer) that is handled via the workpiece carrier 200 in various schematic cross-sectional views during processing, e.g. during method 500 is carried out.

Figure 6A:
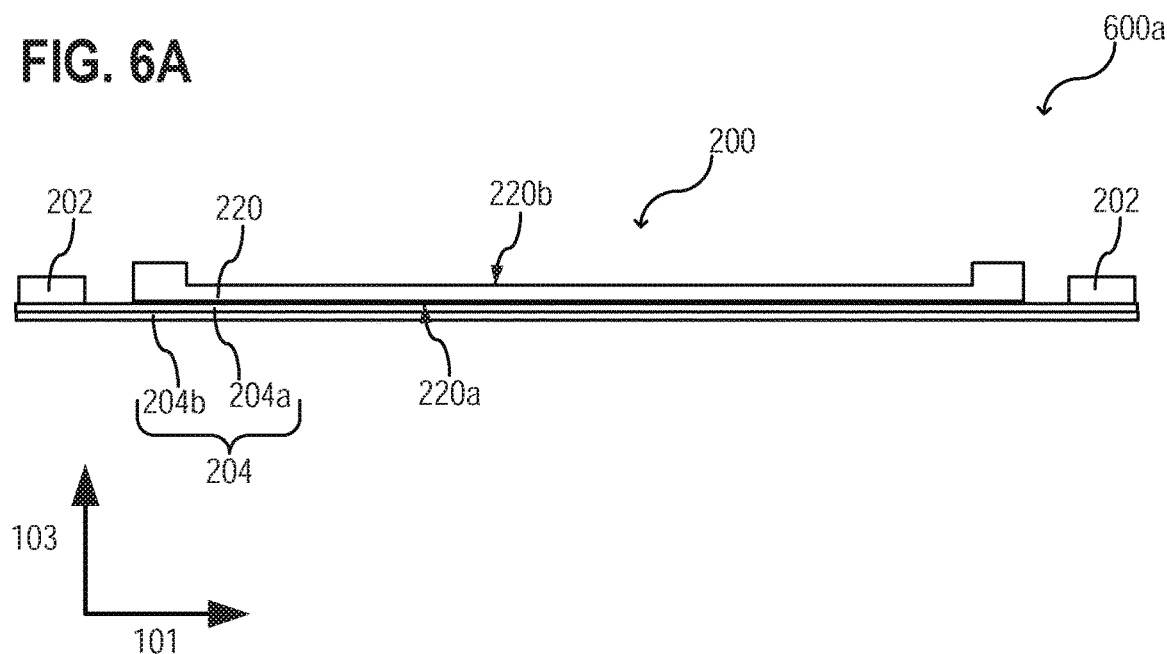

FIG. 6A shows a workpiece 220 at a processing stage 600a, e.g. during method 500 is carried out, e.g. during or after process step 510 of method 500 is carried out. As illustrated in FIG. 6A, the workpiece 220 is mounted to a first tape 204 with a first side 220a of the workpiece 220 facing the first tape 204, wherein the first tape 204 includes a base layer 204b and a light-sensitive adhesive layer 204a to adhere the workpiece 220 to the base layer 204b (see, for example, FIG. 2). Illustratively, the workpiece 220 can be handled via a workpiece carrier 200, as described herein. The tape 204 may be attached to a tape frame 202.

Figure 6B:
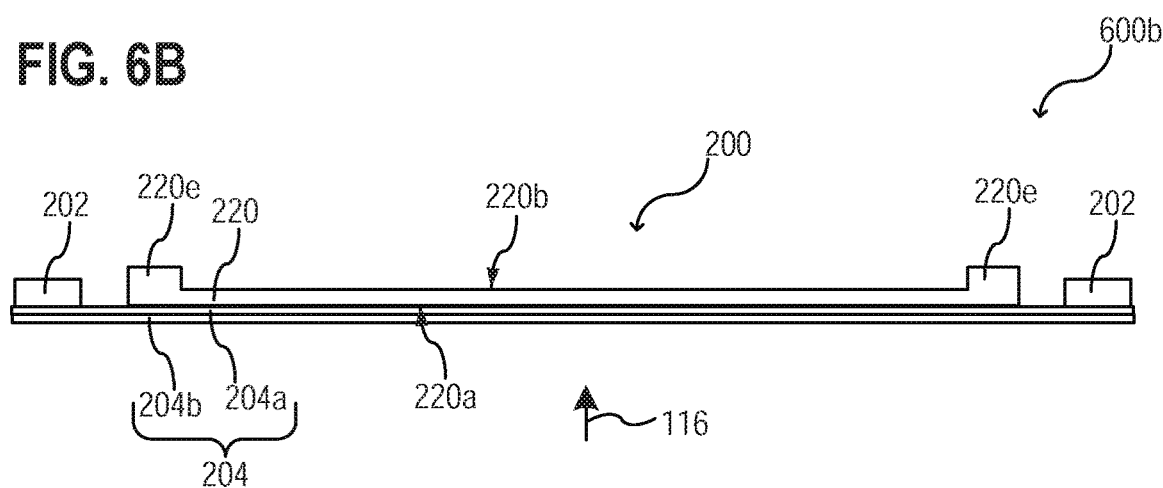

FIG. 6B shows a workpiece 220 at a further processing stage 600b, e.g. during method 500 is carried out, e.g. during or after process steps 510 and 520 of method 500 are carried out. As illustrated in FIG. 6B, the first tape 204 may be illuminated. According to various embodiments, at least the light-sensitive adhesive layer 204a of the first tape 204 may be illuminated through the base layer 204b. The base layer 204b may be transparent for the light 116 that is used to illuminate the light-sensitive adhesive layer 204a.

FIG. 6C and FIG. 6D show a workpiece 220 at further processing stages 600c, 600d, e.g. during method 500 is carried out, e.g. during or after process steps 510, 520 and 530 of method 500 are carried out. As illustrated in FIG. 6C, the workpiece 220 may be processed. As an example, the workpiece 220 may include an edge ring 220e. The edge ring 220e may be formed by grinding the workpiece 220 from its backside (e.g. from side 220b) and thereby removing an inner portion of the workpiece 220 while remaining an edge portion of the workpiece 220 that surround the inner portion.

The workpiece 220 may include, for example, a backside metallization on the backside 220b of the workpiece 220, wherein the backside metallization may be formed after the workpiece 220 is thinned. Further, the workpiece 220 may include a (e.g. processed) front side 220a facing the tape 204, e.g. directly contacting the adhesive layer 204a of the tape. The processed front side may include, for example, one or more integrated circuit structures, one or more microstructures, etc. The workpiece 220 may include, for example, a front side metallization and a front side passivation on the front side 220a of the workpiece 220.

As illustrated in FIG. 6C, the edge ring 220e may be separated from the rest of the workpiece 220 via one or more cutting processes 601, e.g. via mechanical sawing, laser cutting, etc. This process may be referred to as ring cut process. Further, as illustrated in FIG. 6D, the edge ring 220e of the workpiece 220 may be removed, e.g. detached from the tape 204. It has to be noted that the illuminated light-sensitive adhesive layer 204a of the tape 204 generates still enough adhesion force to hold the workpiece 220 in position during the ring cut process and to hold the remaining part of the workpiece 220 in position after the removal of the edge ring 220e.

Figure 6G:
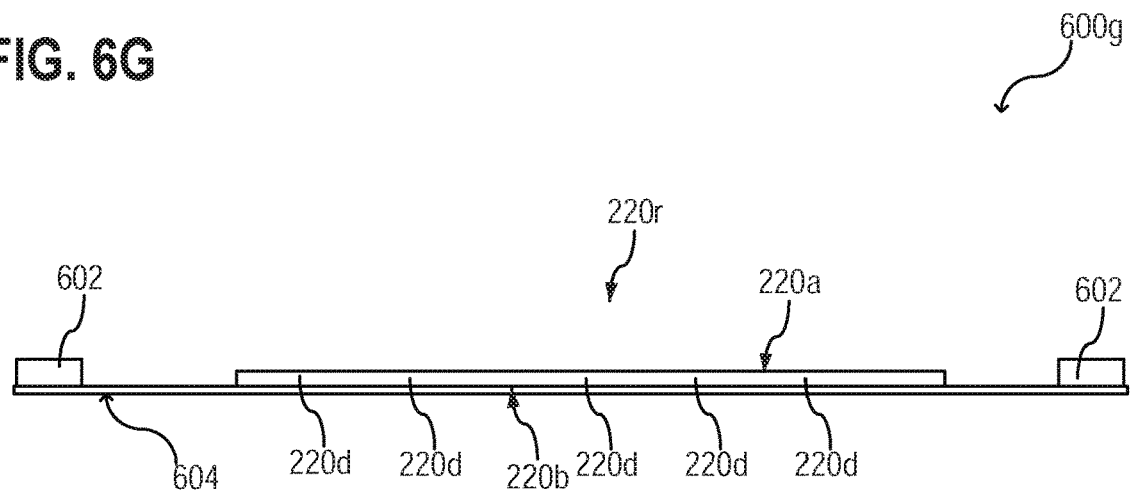

FIG. 6E, FIG. 6F and FIG. 6G show a workpiece 220 (e.g. the remaining part of the workpiece 220 after the edge ring 220e of the workpiece 220 may be removed) at further processing stages 600e, 600f, 600g e.g. during method 500 is carried out, e.g. during or after process steps 510, 520, 530 and 540 of method 500 are carried out. The remaining part of the workpiece 220 (e.g. after the edge ring 220e of the workpiece 220 is removed) may be referred to as remaining workpiece 220r.

As illustrated in FIG. 6E and FIG. 6F, the first tape may be cut 611 and the remaining workpiece 220r with the remaining tape 204r may be attached to a second tape 604 with the backside (e.g. the second side) 220b of the remaining workpiece 220r facing the second tape 604. Illustratively, the remaining workpiece 220r may be remounted to the second tape 604 with the backside (e.g. the second side) 220b of the remaining workpiece 220r facing the second tape 604. The second tape 604 may be a dicing tape and may be attached to a corresponding tape frame 602.

As illustrated in FIG. 6G, the remaining tape 204r may be removed, e.g. peeled off, from the front side 220a of the remaining workpiece 220r. According to various embodiments, the tape 204 may be illuminated before the ring cut process, and, therefore, may be peeled off without any substantial residues from the remaining workpiece 220r.

After the remaining tape 204r is removed, the front side 220a of the remaining workpiece 220r may be exposed. Subsequently, the remaining workpiece 220r may be processed further from the front side. As an example, the remaining workpiece 220r may be diced into a plurality of dies.

Figure 6H:
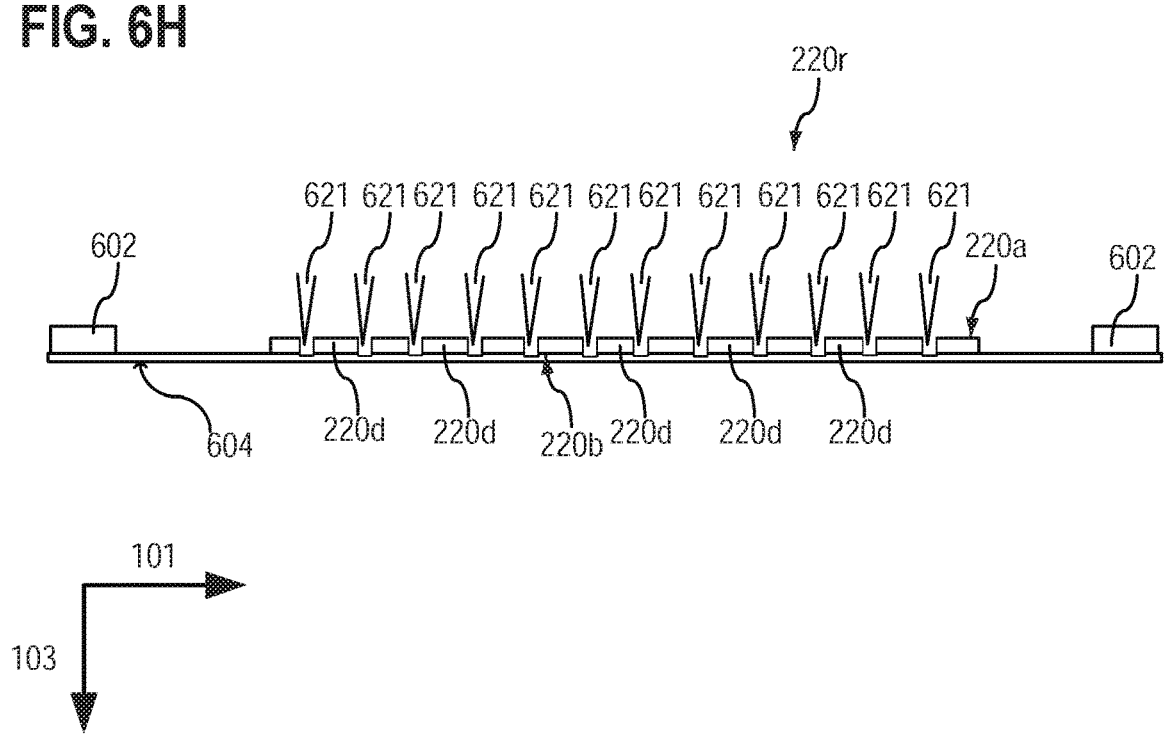

According to various embodiments, after remounting the workpiece 200r (e.g. after method 500 is carried out) to the second tape 604, the workpiece 220r may be separated (e.g. diced) 621 into a plurality of portions (e.g. dies, chips, etc.) 220d, as illustrated in FIG. 6H in a schematic cross-sectional view. According to various embodiments, the second tape 604 may be configured in the same or similar way as the first tape 204 (e.g. both tapes may be dicing tapes); however, the second tape 604 may not be illuminated before the dicing process. As an example, the second tape 604 may include a light-sensitive adhesive layer that is illuminated after the workpiece 220r is diced.

Figure 7:
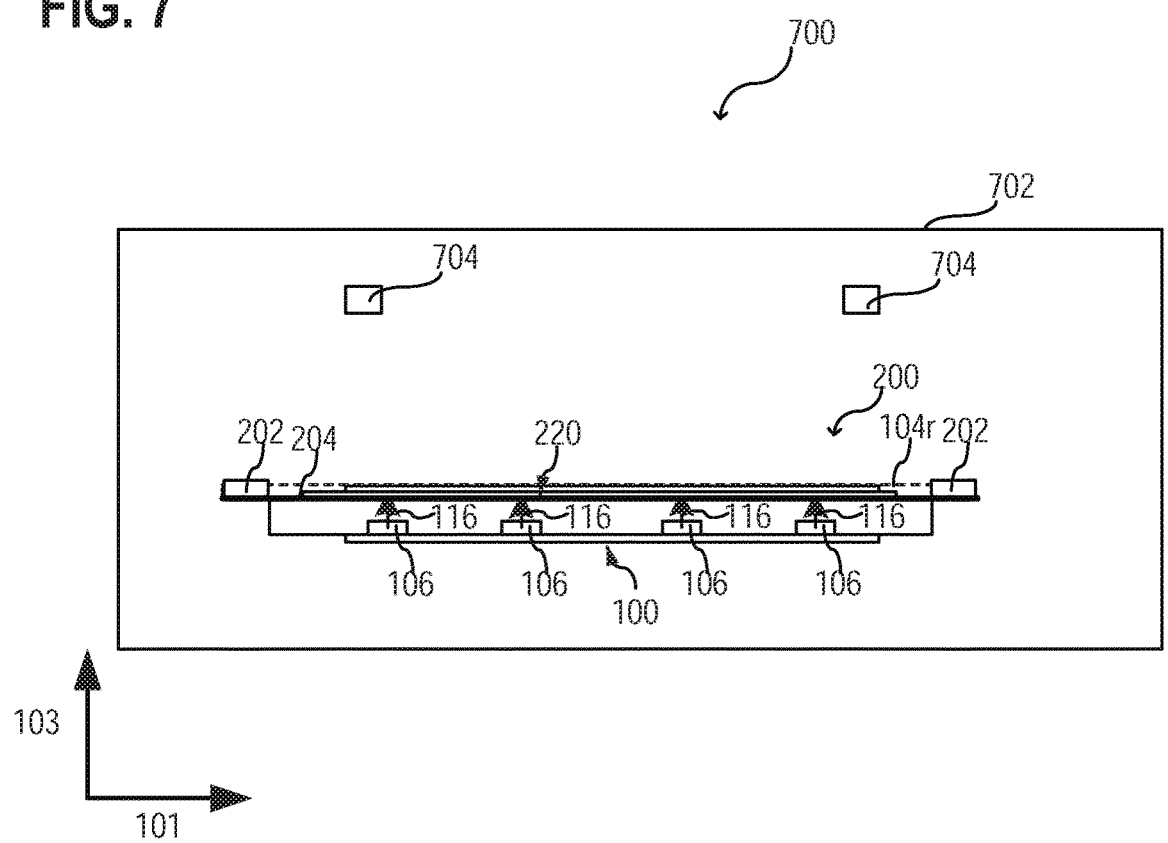
FIG. 7 shows a processing arrangement in a schematic cross-sectional view, according to various embodiments.

FIG. 7 shows a processing arrangement 700 in a schematic cross-sectional view, according to various embodiments. The processing arrangement 700 may be a semiconductor processing arrangement. According to various embodiments, the processing arrangement 700 may include one or more processing tools 702 (e.g. semiconductor processing tools) for processing and/or handling at least one workpiece 220 (e.g. at least one wafer); and at least one support table 100 (e.g. as described with reference to FIGS. 1A to 1F, and/or FIG. 3) to support the workpiece 220 in at least one of the one or more processing tools 702. According to various embodiments, the processing arrangement 700 may include a dicing tool.

According to various embodiments, the processing arrangement 700 may include one or more processing tools 702 for processing and/or handling at least one workpiece carrier 200, the workpiece carrier having a workpiece 220 attached thereto (see, for example, FIG. 2). The processing arrangement 700 may further include a support table 100 to support the at least one workpiece carrier 200 in at least one of the one or more processing tools 702 (see, for example, FIGS. 1A to 1F, and/or FIG. 3).

According to various embodiments, the one or more processing tools 702 may include a mounting tool for attaching the workpiece to the workpiece carrier 200. The support table 100 may be disposed inside the mounting tool for in-situ illumination of the tape 204 of the workpiece carrier 200. The mounting tool may include one or more optical sensors (e.g. cameras) for determining a position of the workpiece 220 and/or of the workpiece carrier 200.

According to various embodiments, the one or more processing tools 702 may include a cutting tool for removing an edge region 220e of the workpiece 220 (see, for example, FIGS. 6C and 6D).

According to various embodiments, the one or more processing tools 702 may include a dicing tool for dicing the workpiece 220 into a plurality of portions 220d (see, for example, FIG. 6H).

According to various embodiments, one or more light sensors (e.g. UV-light sensors) 704 may be disposed in at least one of the processing tools, e.g. in the same processing tool in which a support table 100 is disposed.

According to various embodiments, the processing tool in which the support table 100 is disposed may include a controller configured to control the operation of the one or more light-emitting components 106 of the support table 100. As an example, the tape 204 of the workpiece carrier 200 may be illuminated with UV-light (e.g. having a peak wavelength of about 365 nm) for a time duration of less than about 20 s. The short illumination time may be achieved by a short distance between the tape 204 of the workpiece carrier 200 and the one or more light-emitting components 106 during illumination. As an example, the distance between the tape 204 one or more light-emitting components 106 during illumination may be less than about 2 cm, less than about 1 cm.

Figure 8:
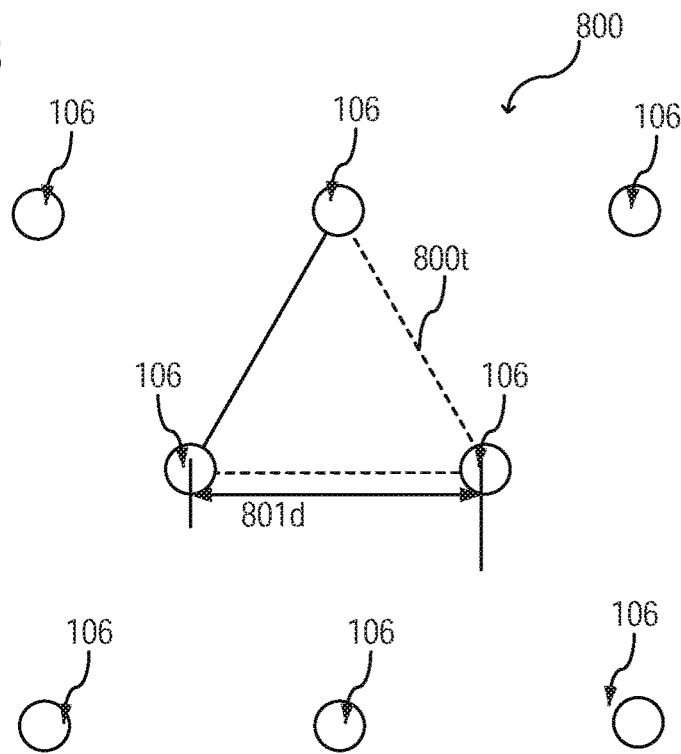
FIG. 8 shows an arrangement of light emitting components in a schematic view, according to various embodiments.

FIG. 8 shows an arrangement 800 of a plurality of light-emitting components 106 in a schematic view, according to various embodiments. The light-emitting components 106 of the support table 100 may be provided in an equilateral triangle 800t arrangement. The distance 801d between the respective neighboring light-emitting components 106 may be in the range from about 10 mm to about 50 mm, e.g. in the range from about 20 mm to about 40 mm. This may allow, for example, a substantially homogenous illumination of the support region of the support table 100.

The light-emitting components 106 may be light-emitting diodes (LEDs), e.g. UV-LEDs.

Various examples are described in the following referring to the embodiments provided above.

Example 1 is a support table 100, including: a baseplate 102; a support structure 104, the support structure 104 defining a support region 104r over the baseplate 102 to support at least one of a workpiece 220 or a workpiece carrier 200 therein; and one or more light-emitting components 106 disposed between the baseplate 102 and the support region 104r, wherein the one or more light-emitting components 106 are configured to emit light 116 into the support region 104r.

In Example 2, the support table 100 of example 1, may further include that the support structure 104 includes a support plate 108 disposed between the support region 104r and the baseplate 102, the support plate 108 including one or more support surfaces 104s facing away from the baseplate 102 to support at least one of a workpiece 220 or a workpiece carrier 200 thereon.

In Example 3, the support table 100 of example 2, may further include that the one or more light-emitting components 106 are configured to emit light in the direction of the support plate 108 and that the support plate 108 is configured to pass light emitted from the one or more light-emitting components 106 through the support plate 108 into the support region 104r.

In Example 4, the support table 100 of example 2 or 3 may further include that the support plate 108 includes a material that is transparent for ultra-violet light.

In Example 5, the support table 100 of any one of examples 2 to 4 may further include that the support plate 108 includes or consists of glass, preferably a silica-based glass.

In Example 6, the support table 100 of any one of examples 1 to 5 may further include that the one or more light-emitting components 106 are configured to emit ultra-violet light.

In Example 7, the support table 100 of any one of examples 1 to 6 may further include that the one or more light-emitting components 106 include one or more light-emitting diodes.

In Example 8, the support table 100 of any one of examples 1 to 7 may further include: a reflector 110 disposed between the baseplate 102 and the support region 104r, wherein the reflector 110 includes one or more recesses 110r associated with the one or more light-emitting components 106.

In Example 9, the support table 100 of example 8 may further include that the one or more light-emitting components 106 are disposed within the one or more recesses 110r and/or that the one or more light-emitting components 106 are configured to emit the light 116 through the one or more recesses 110r into the support region 104r.

In Example 10, the support table 100 of example 8 or 9 may further include that the reflector 110 includes a material that reflects ultra-violet light.

In Example 11, the support table 100 of any one of examples 8 to 10 may further include that the reflector 110 includes or consists of aluminum.

In Example 12, the support table 100 of any one of examples 1 to 11 may further include that the one or more light-emitting components 106 are attached to a mounting plate 410.

In Example 13, the support table 100 of example 12 may further include that the mounting plate 410 is attached to the baseplate 102.

In Example 14, the support table 100 of any one of examples 1 to 13 may further include: a cooling structure 112 configured to dissipate heat from the one or more light-emitting components.

In Example 15, the support table 100 of example 14 may further include that the cooling structure 112 includes one or more cooling channels disposed in the baseplate 102.

In Example 16, the support table 100 of any one of examples 1 to 15 may further include: a temperature sensor 114 associated with the one or more light-emitting components 106.

In Example 17, the support table 100 of any one of examples 1 to 16 may further include that the one or more light-emitting components 106 include a plurality of light-emitting components 106 in an equilateral triangle arrangement.

In Example 18, the support table 100 of any one of examples 1 to 17 may further include that the support region 104r has a width or diameter in the range from about 10 cm to about 50 cm.

In Example 19, the support table 100 of any one of examples 1 to 17 may further include that the support region 104r is configured to host a semiconductor wafer or a tape frame 204 for carrying a semiconductor wafer.

In Example 20, the support table 100 of any one of examples 1 to 19 may further include that the support structure 104 includes one or more support surfaces 104s arranged within a single plane.

In Example 21, the support table 100 of any one of examples 1 to 20 may further include that the support structure 104 includes one or more attachment structures 412 to attach at least one of a workpiece 220 or a workpiece carrier 200 to the support structure 104.

In Example 22, the support table 100 of example 21 may further include that the one or more attachment structures 412 includes at least one of the following: one or more magnets, one or more suction ducts, or one or more clamps.

Example 23 is a processing arrangement 700 including: one or more processing tools 702 for processing and/or handling at least one workpiece carrier 200, the workpiece carrier 200 having a workpiece 220 attached thereto; and a support table 100 of any one of examples 1 to 18 to support the at least one workpiece carrier 200 in at least one of the one or more processing tools 702.

In Example 24, the processing arrangement 700 of example 23 may further include that the one or more processing tools 702 include a mounting tool for attaching the workpiece to the workpiece carrier 200.

In Example 25, the processing arrangement 700 of example 23 or 24 may further include that the one or more processing tools 702 include a cutting tool for removing an edge region 220e of the workpiece 220.

In Example 26, the processing arrangement 700 of any one of examples 23 to 25 may further include that the one or more processing tools 702 include a dicing tool for dicing the workpiece 220 into a plurality of portions 220d.

Example 27 is a support table assembly 300 for processing a workpiece 220, the support table assembly 300 including: a workpiece carrier 200, the workpiece carrier 200 including a tape frame 202 and a tape 204 attached to the tape frame 202, wherein the tape 204 includes a base layer 204b and a light-sensitive adhesive layer 204a to adhere a workpiece 220 to the workpiece carrier 200; a support table 100 configured to support the workpiece carrier 200, wherein the support table 100 includes one or more light-emitting components 106 configured to emit light 116 into the direction of the tape 204 when the workpiece carrier 200 is supported by the support table 100, wherein the base layer 204b of the tape 204 is transparent for the light 116 emitted by the one or more light-emitting components 106 for illumination of at least the light-sensitive adhesive layer 204a of the tape 204.

In Example 28, the support table assembly 300 of example 27 may further include that the tape 204 is a dicing tape.

In Example 29, the support table assembly 300 of example 27 or 28 may further include that the workpiece 220 is a semiconductor wafer and that the workpiece carrier 200 is a wafer carrier.

In Example 30, the support table assembly 300 of any one of examples 27 to 29 may further include that base layer 204b includes or consists of a polymer.

In Example 31, the support table assembly 300 of example 30 may further include that the polymer is a poly olefin PO, preferably at least one of polyethylene, polypropylene, polymethylpentene, polybutene-1, polyisobutylene, ethylene propylene rubber, ethylene propylene diene monomer rubber.

In Example 32, the support table assembly 300 of example 30 may further include that the polymer is polyvinyl chloride PVC.

In Example 33, the support table assembly 300 of any one of examples 27 to 32 may further include that the base layer 204b has a layer thickness 203b in the range from about 60 µm to about 300 µm.

In Example 34, the support table assembly 300 of any one of examples 27 to 33 may further include that the light-sensitive adhesive layer 204a includes or consists of an adhesive material configured to reduce its adhesion strength when exposed to ultra-violet light.

In Example 35, the support table assembly 300 of any one of examples 27 to 34 may further include that the light-sensitive adhesive layer 204a includes or consists of an UV sensitive acrylic adhesive.

In Example 36, the support table assembly 300 of any one of examples 27 to 35 may further include that the light-sensitive adhesive layer 204a has a layer thickness 203a in the range from about 5 µm to about 25 µm.

In Example 37, the support table assembly 300 of any one of examples 27 to 36 may further include that the a support table 100 includes a baseplate 102 and a support structure 104, the support structure 104 defining a support region 104r over the baseplate 102 to support the workpiece carrier 200 therein, and that the one or more light-emitting components 106 are configured to emit the light 116 into the support region 104r.

In Example 38, the support table assembly 300 of example 37 may further include that the support structure 104 includes a support plate 108 disposed between the support region 104r and the baseplate 102, the support plate 108 including a support surface facing away from the baseplate 102 to support the workpiece carrier 200 thereon.

In Example 39, the support table assembly 300 of example 38 may further include that the one or more light-emitting components 106 are configured to emit the light 116 in the direction of the support plate 108 and that the support plate 108 is configured to pass light emitted from the one or more light-emitting components 106 through the support plate 108 into the support region 104r.

In Example 40, the support table assembly 300 of example 38 or 39 may further include that the support plate 108 includes a material that is transparent for ultra-violet light.

In Example 41, the support table assembly 300 of any one of examples 38 to 40 may further include that the support plate 108 includes or consists of glass, preferably a silica-based glass.

In Example 42, the support table assembly 300 of any one of examples 38 to 41 may further include that the support table 100 further includes a reflector 110 disposed between the baseplate 102 and the support region 104r, wherein the reflector 110 includes one or more recesses 110r associated with the one or more light-emitting components 106.

In Example 43, the support table assembly 300 of example 42 may further include that the one or more light-emitting components 106 are disposed within the one or more recesses 110r and/or that the one or more light-emitting components 106 are configured to emit the light 116 through the one or more recesses 110r into the support region 104r.

In Example 43, the support table assembly 300 of example 42 or 43 may further include that the reflector 110 includes a material that reflects ultra-violet light.

In Example 44, the support table assembly 300 of any one of examples 42 to 43 may further include that the reflector 110 includes or consists of aluminum.

In Example 45, the support table assembly 300 of any one of examples 38 to 44 may further include that the one or more light-emitting components 106 are attached to a mounting plate 410; and that the mounting plate 410 is attached to the baseplate 102.

In Example 46, the support table assembly 300 of any one of examples 38 to 45 may further include that the support region 104r has a width or diameter in the range from about 10 cm to about 50 cm.

In Example 47, the support table assembly 300 of any one of examples 38 to 46 may further include that the support region 104r is configured to host the workpiece carrier 200.

In Example 48, the support table assembly 300 of any one of examples 38 to 47 may further include that the support structure 104 includes one or more support surfaces 104s arranged within a single plane.

In Example 49, the support table assembly 300 of any one of examples 38 to 48 may further include that the support structure 104 includes one or more attachment structures 412 to attach the workpiece carrier 200 to the support structure 104.

In Example 50, the support table assembly 300 of example 49 may further include that the one or more attachment structures 412 includes at least one of the following: one or more magnets, one or more suction ducts, and/or one or more clamps.

In Example 51, the support table assembly 300 of any one of examples 27 to 50 may further include that the support table 100 further includes a cooling structure 112 configured to dissipate heat from the one or more light-emitting components 106.

In Example 52, the support table assembly 300 of any one of examples 27 to 51 may further include that the support table 100 further includes a temperature sensor 114 associated with the one or more light-emitting components 106.

In Example 53, the support table assembly 300 of any one of examples 27 to 52 may further include that the one or more light-emitting components 106 include a plurality of light-emitting components 106 in an equilateral triangle arrangement.

In Example 54, the support table assembly 300 of any one of examples 27 to 53 may further include that the one or more light-emitting components 106 are configured to emit ultra-violet light.

In Example 55, the support table assembly 300 of any one of examples 27 to 54 may further include that the one or more light-emitting components 106 include one or more light-emitting diodes.

Example 56 is a support table 100, including: a baseplate 102; a support structure 104 disposed over the baseplate 102, the support structure 104 including one or more support surfaces 104s facing away from the baseplate 102 to support at least one of a workpiece 220 or a workpiece carrier 200 thereon; and one or more light-emitting components 106 disposed between the baseplate 102 and the support structure 104, wherein the one or more light-emitting components 106 are configured to emit light 116 in the direction of the support structure 104 and wherein the support structure 104 is configured to pass the light 116 emitted from the one or more light-emitting components 106 through the one or more support surfaces 104s.

Example 57 is a method 500 for processing a workpiece, the method including: mounting the workpiece to a first tape with a first side of the workpiece facing the first tape, wherein the first tape includes a base layer and a light-sensitive adhesive layer to adhere the workpiece to the base layer; after mounting the workpiece to the first tape, illuminating the light-sensitive adhesive layer of the first tape through the base layer; after illuminating the light-sensitive adhesive layer of the first tape, processing the workpiece; and, subsequently, remounting the workpiece to a second tape with a second side of the workpiece facing the second tape, wherein the second surface is opposite to the first surface.

In Example 58, the method 500 of example 57, may further include: after remounting the workpiece to the second tape, separating the workpiece into a plurality of portions.

In Example 59, the method 500 of example 57 or 58 may further include that processing the workpiece includes removing an edge portion of the workpiece.

In Example 60, the method 500 of any one of examples 57 to 59 may further include that the first side of the workpiece is patterned.

In Example 61, the method 500 of any one of examples 57 to 60 may further include that the workpiece is a semiconductor workpiece, preferably a semiconductor wafer.

In Example 62, the method 500 of example 61 may further include that the first side is a front side of the semiconductor workpiece and that the second side is a back side of the semiconductor workpiece.

In Example 63, the method 500 of any one of examples 57 to 62 may further include that the workpiece includes one or more microstructures disposed at the first side of the workpiece.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes, which come within the meaning and range of equivalency of the claims, are therefore intended to be embraced.

What is claimed is:
1. A support table assembly for processing a workpiece, the support table assembly comprising:
   a workpiece carrier comprising a tape frame and a tape attached to the tape frame, the tape comprising a base layer and a light-sensitive adhesive layer configured to adhere a workpiece to the workpiece carrier; and a support table configured to support the workpiece carrier and comprising one or more light-emitting components configured to emit light into a direction of the tape when the workpiece carrier is supported by the support table, wherein the base layer of the tape is transparent for the light emitted by the one or more light-emitting components, for illumination of at least the light-sensitive adhesive layer of the tape, wherein the support table comprises a baseplate and a support structure, the support structure defining a support region over the baseplate to support the workpiece carrier therein, wherein the support table further comprises a reflector plate disposed between the baseplate and the support region, wherein the reflector plate has one or more openings vertically aligned with the one or more light-emitting components such that the light emitted by the one or more light-emitting components passes through the one or more openings in the reflector plate and into the support region.

2. The support table assembly of claim 1, wherein the support structure comprises a support plate disposed between the support region and the baseplate, the support plate comprising a support surface facing away from the baseplate configured to support the workpiece carrier thereon.

3. The support table assembly of claim 2, wherein the one or more light-emitting components are configured to emit the light in a direction of the support plate, and wherein the support plate is configured to pass light emitted from the one or more light-emitting components through the support plate into the support region.

4. The support table assembly of claim 2, wherein the support plate comprises a material that is transparent for ultra-violet light.

5. The support table assembly of claim 1, wherein the base layer comprises a polymer.

6. The support table assembly of claim 5, wherein the polymer is a poly olefin.

7. The support table assembly of claim 1, wherein the workpiece is a semiconductor wafer, and wherein the workpiece carrier is a wafer carrier.

8. The support table assembly of claim 1, wherein the tape is a dicing tape.

9. The support table assembly of claim 1, wherein the base layer has a layer thickness in a range from about 60 µm to about 300 µm.

10. The support table assembly of claim 1, wherein the light-sensitive adhesive layer comprises an adhesive material configured to reduce an adhesion strength of the light-sensitive adhesive layer when exposed to ultra-violet light.

11. The support table assembly of claim 1, wherein the light-sensitive adhesive layer has a layer thickness in a range from about 5 µm to about 25 µm.

12. The support table assembly of claim 1, wherein the reflector plate comprises aluminum.

13. The support table assembly of claim 1, wherein the support structure comprises one or more attachment structures configured to attach the workpiece carrier to the support structure.

14. The support table assembly of claim 1, wherein the support table further comprises a cooling structure configured to dissipate heat from the one or more light-emitting components.

15. The support table assembly of claim 1, wherein the support table further comprises a temperature sensor associated with the one or more light-emitting components.

16. The support table assembly of claim 1, wherein the one or more light-emitting components comprise a plurality of light-emitting components in an equilateral triangle arrangement.

17. The support table assembly of claim 1, wherein the one or more light-emitting components are configured to emit ultra-violet light, and wherein the reflector plate comprises a material that reflects ultra-violet light.

18. The support table assembly of claim 1, wherein the support structure includes one or more vacuum mounts configured to attach the workpiece carrier to the support structure.

19. A support table, comprising:
a baseplate;
a support structure defining a support region over the baseplate to support at least one of a workpiece or a workpiece carrier therein;
one or more light-emitting components disposed between the baseplate and the support region, the one or more light-emitting components configured to emit light into the support region; and
a reflector plate disposed between the baseplate and the support region, the reflector plate having one or more openings vertically aligned with the one or more light-emitting components such that the light emitted by the one or more light-emitting components passes through the one or more openings in the reflector plate and into the support region.

20. A processing arrangement, comprising:
one or more processing tools configured to process and/or handle at least one workpiece carrier, the workpiece carrier having a workpiece attached thereto; and
the support table of claim 19 to support the at least one workpiece carrier in at least one of the one or more processing tools.

21. The processing arrangement of claim 20, wherein the one or more processing tools comprise a mounting tool configured to attach the workpiece to the workpiece carrier, and/or wherein the one or more processing tools comprise a cutting tool configured to remove an edge region of the workpiece, and/or wherein the one or more processing tools comprise a dicing tool configured to dice the workpiece into a plurality of portions.

22. A support table, comprising:
a baseplate;
a support structure defining a support region over the baseplate to support at least one of a workpiece or a workpiece carrier therein;
one or more light-emitting components disposed between the baseplate and the support region, the one or more light-emitting components configured to emit light into the support region;
one or more cooling channels disposed in the baseplate and configured to carry a cooling fluid for dissipating heat from the one or more light-emitting components; and
a reflector plate disposed between the baseplate and the support region,
wherein the reflector plate has one or more openings vertically aligned with the one or more light-emitting components such that the light emitted by the one or more light-emitting components passes through the one or more openings in the reflector plate and into the support region.

23. The support table of claim 22, wherein the support structure includes one or more vacuum mounts configured to attach a workpiece carrier to the support structure.

24. The support table of claim 22, wherein the one or more light-emitting components are configured to emit ultra-violet light, and wherein the reflector plate comprises a material that reflects ultra-violet light.

* * * * *